(12) United States Patent
Kashiwakura

(10) Patent No.: US 8,049,118 B2
(45) Date of Patent: Nov. 1, 2011

(54) PRINTED CIRCUIT BOARD

(75) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 1000 days.

(21) Appl. No.: 11/944,813

(22) Filed: Nov. 26, 2007

(65) Prior Publication Data

US 2008/0121421 A1     May 29, 2008

(30) Foreign Application Priority Data

Nov. 24, 2006    (JP) ................................. 2006-317214

(51) Int. Cl.
*H05K 1/11*     (2006.01)
(52) U.S. Cl. ...................................................... 174/262
(58) Field of Classification Search .......... 174/262–266; 361/792–795
See application file for complete search history.

(56) References Cited

U.S. PATENT DOCUMENTS

| | | | | |
|---|---|---|---|---|
| 7,149,092 B2* | 12/2006 | Iguchi | ............................ | 361/780 |
| 2004/0150970 A1 | 8/2004 | Lee | | |
| 2005/0098348 A1* | 5/2005 | Okumichi et al. | ............ | 174/262 |

FOREIGN PATENT DOCUMENTS

| | | |
|---|---|---|
| JP | 2000068713 A | 3/2000 |
| JP | 2003031945 A | 1/2003 |
| JP | 2003133801 A | 5/2003 |
| JP | 2003217745 | 7/2003 |
| JP | 2004165200 | 6/2004 |
| JP | 2004327690 | 11/2004 |
| JP | 2005175189 | 6/2005 |
| JP | 2005351731 | 12/2005 |
| JP | 2006211070 | 8/2006 |

OTHER PUBLICATIONS

Japanese Office Action for JP2006-317214 issued Jul. 26, 2011.

* cited by examiner

*Primary Examiner* — Jeremy Norris
*Assistant Examiner* — Tremesha S Willis

(57) ABSTRACT

Printed circuit board in which deterioration of signal transmission characteristics otherwise caused by a stub parasitically formed in a through-hole is suppressed to provide optimum high-speed signal transmission characteristics. A printed circuit board 10 includes a power supply/ground layer 11 and a signal line 12b in a dielectric layer 13, and a through-hole 12 connected to the signal line 12b. A clearance 14 which becomes an anti-pad is provided in an area between the through-hole 12 and the power supply/ground layer 11. The signal line 12b is extended from the through-hole 12 through the clearance 14 to an area below the power supply/ground layer 11. The portion of the signal line 12b arranged in the vicinity of the power supply/ground layer 11 in the clearance 14 has an area of impedance gradient 17 whose characteristic impedance becomes progressively lower in a direction away from the through-hole 12.

7 Claims, 8 Drawing Sheets

(FIRST EXAMPLE)

FIG. 1A (FIRST EXAMPLE)
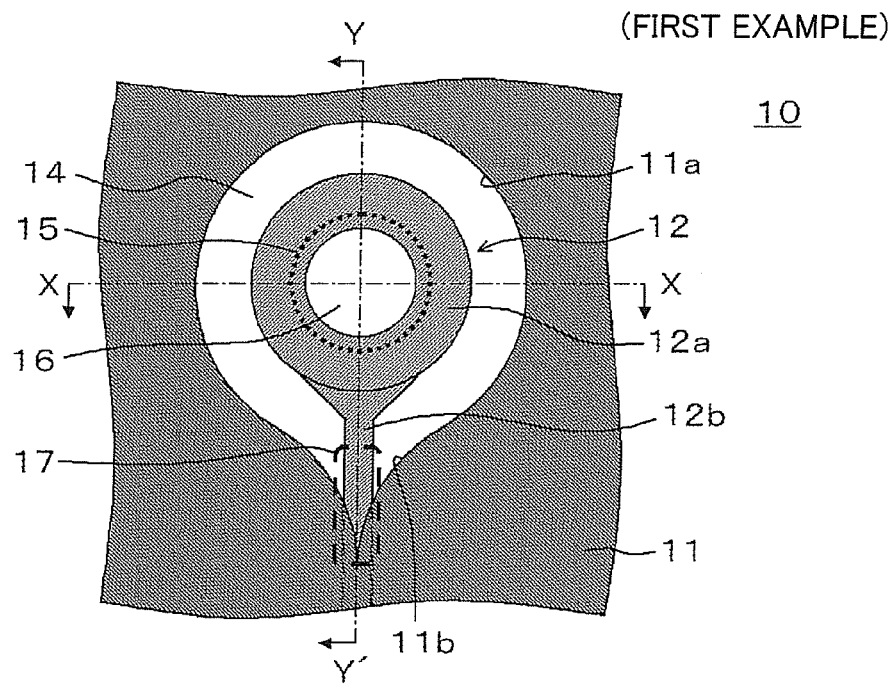
FIG. 1B  X–X'  (FIRST EXAMPLE)
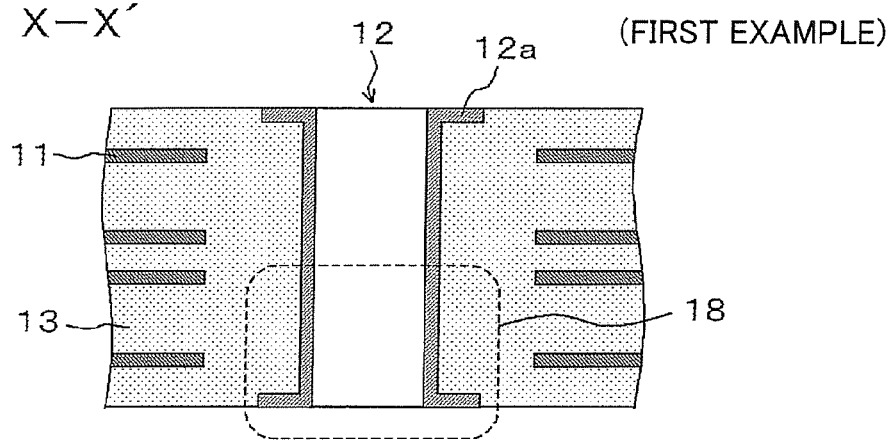
FIG. 1C  Y–Y'  (FIRST EXAMPLE)
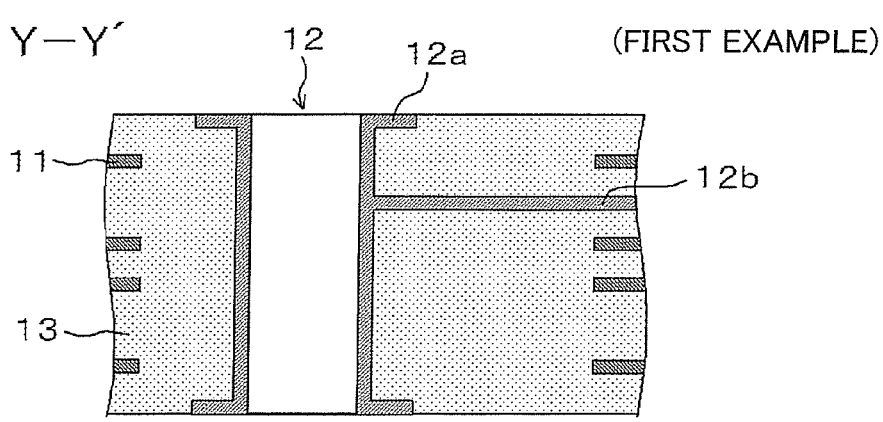

(FIRST EXAMPLE)

(SECOND EXAMPLE)

FIG. 5A                                          (RELATED ART 1)
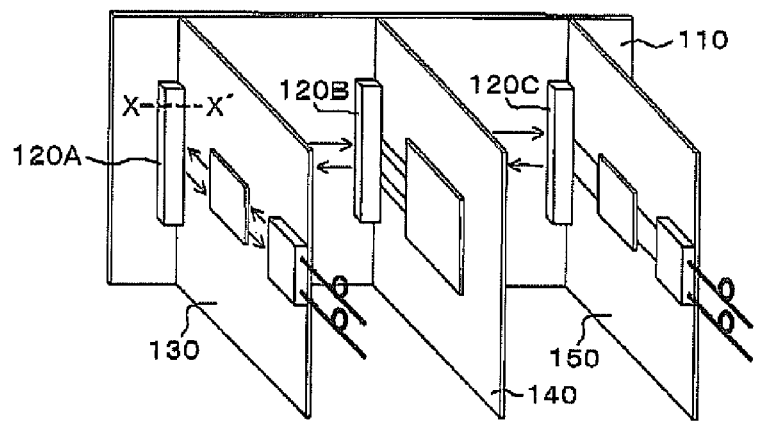
FIG. 5B  X–X'                                    (RELATED ART 1)
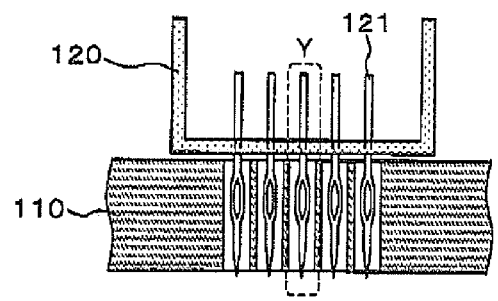
FIG. 5C  ENLARGED VIEW OF PART Y                 (RELATED ART 1)
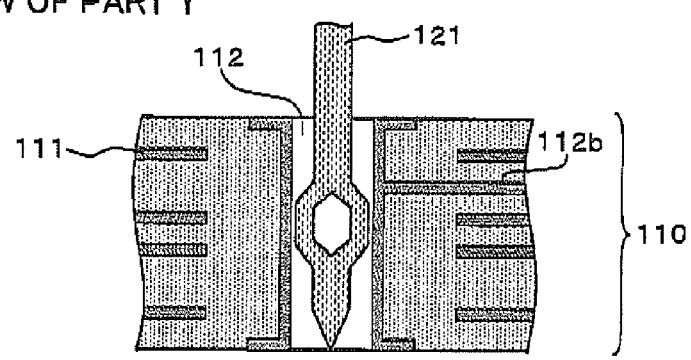

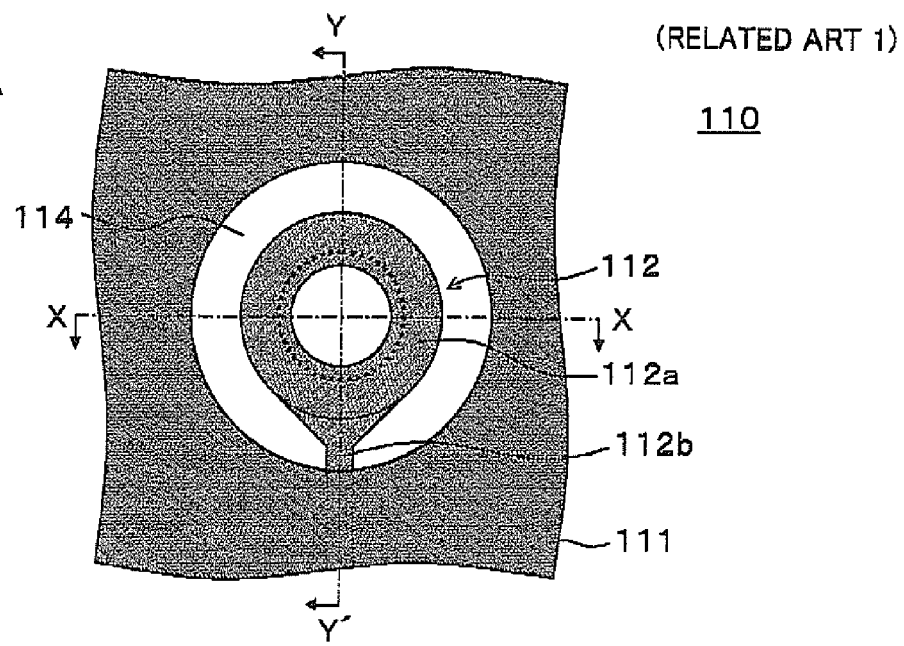
FIG. 6A (RELATED ART 1)
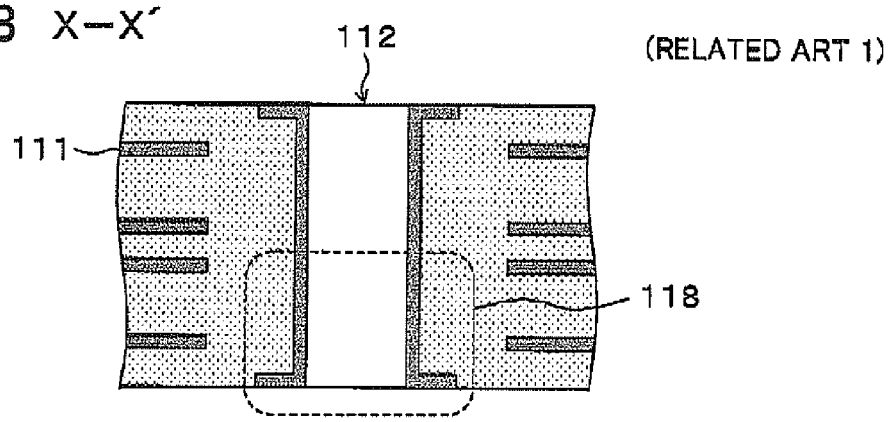
FIG. 6B X-X' (RELATED ART 1)
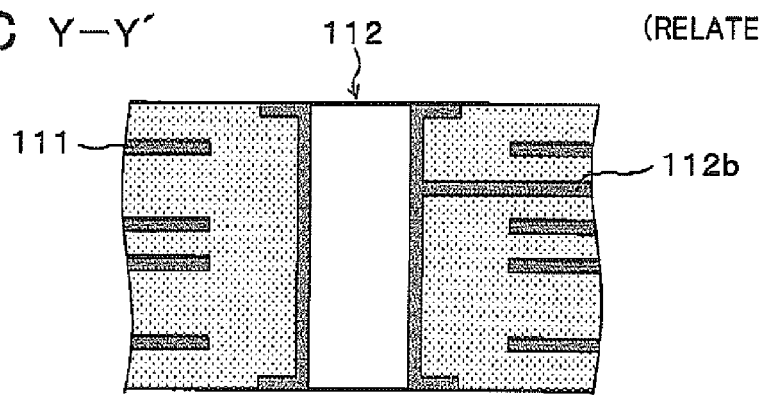
FIG. 6C Y-Y' (RELATED ART 1)

PRINTED CIRCUIT BOARD

REFERENCE TO RELATED APPLICATION

The present application is claiming the priority of the earlier Japanese patent application No. 2006-317214 filed on Nov. 24, 2006, the entire disclosure thereof being incorporated herein by reference thereto.

FIELD OF THE INVENTION

This invention relates to a printed circuit board and, more particularly, to a printed circuit board having through-holes for high-speed signal transmission.

BACKGROUND OF THE INVENTION

The processing capability of communication apparatus is increasing from year to year and, in keeping up therewith, the transmission speed of a backplane is also increasing. The signal speed already exceeded 1 Gbps and is even nearing 10 Gbps. It has been known that a branch (stub) parasitically formed by a through-hole in the backplane is a factor that deteriorates high-speed transmission characteristics. To realize transmission in excess of 10 Gbps or higher, it is mandatory how to avoid the stub in the through-hole from being built up in the backplane.

FIGS. 5A to 5C show a backplane system in a conventional communication apparatus. In this conventional backplane system, a printed circuit board 110, as a backplane, is connected to network cards 130, 150 and a switch card 140 via connectors 120A, 120C and 120B, respectively. Since a press-fit terminal is used in general as a terminal 121 of the connector 120, a through-hole 112 is indispensable in the printed circuit board 110.

In the related art, the following techniques have been proposed in connection with coping with deterioration of characteristics ascribable to through-hole stubs.

[Patent Document 1]
JP Patent Kokai Publication No. JP-P2003-217745A
[Patent Document 2]
JP Patent Kokai Publication No. JP-P2004-165200A
[Patent Document 3]
JP Patent Kokai Publication No. JP-P2004-327690A
[Patent Document 4]
JP Patent Kokai Publication No. JP-P2005-175189A
[Patent Document 5]
JP Patent Kokai Publication No. JP-P2005-35173 LA
[Patent Document 6]
JP Patent Kokai Publication No. JP-P2006-211070A

SUMMARY OF THE DISCLOSURE

The following analysis is given by the present invention. The entire disclosures of the above mentioned Patent Documents are herein incorporated by reference thereto.

Patent Document 1 discloses a technique in which an electrical short stub is provided on a transmission path in the vicinity of a daughter board to absorb the impedance mismatch between the daughter board and the backboard. It is however apparent that, in a high-speed signal, the signal rise is steep, so that even a short stub or a stub in a through-hole acts as a transmission line and becomes a factor responsible for multiple reflections. Moreover, since the short stub connects to the ground (GND), there is generated an unforeseen undesirable offset voltage in the actual signal transmission.

Patent Document 2 discloses a technique for reducing the skew in a differential signal. However, no reference is made in this Publication to suppression of reflections associated with the through-hole.

Patent Document 3 discloses a technique in which a through-hole is of a coaxial configuration to secure a return current path in the through-hole of a printed circuit board. However, there is shown no solution as to the stub associated with the through-hole generated in a multi-layer circuit substrate.

Patent Document 4 discloses a technique in which an electrically conductive layer is provided between two ground layers to secure a return current path for the through-hole of a printed circuit board. However, as in Patent Document 3, there is shown no solution as to the stub associated with a through-hole generated in a multi-layer circuit substrate.

Patent Document 5 discloses a technique in which a metal probe is introduced in a through-hole of an electrically conductive pattern connected to ground (GND) to constitute a test socket. However, as in Patent Document 3, no reference is made to the stub associated with a through-hole.

Patent Document 6 discloses a multi-layered circuit substrate having a dielectric substrate, a signal line connected to a capacitive load and a ground layer, in which the signal line has a narrow-width section, connected to the capacitive load, and a broad-width section. However, since a clearance for insulating the through-hole from the ground layer necessarily exists around the through-hole, and the signal line, connected to the through-hole, is passed over the clearance, there is raised a problem that signal line impedance cannot be controlled in the vicinity of the through-hole. In particular, the higher the frequency, the more difficult it becomes to discount the gap length (interstice) of the clearance and hence the more difficult it becomes to control the impedance of the signal line. Further, in high density designing, a limit value of the design and production rule is frequently used as the width of the broad-width section of the signal line. Hence, it becomes difficult to use a narrow-width section narrower than the broad-width section.

It is therefore a principal object of the present invention to provide a printed circuit board in which deterioration in characteristics ascribable to stubs, parasitically generated in through-holes of a printed circuit board, especially those associated with press-fit connectors, may be suppressed to provide for optimum high-speed transmission characteristics.

According to the present invention, there is provided a printed circuit board in which a power supply/ground layer and a signal line are provided in a dielectric layer, and in which through-hole connected to the signal line is formed. A clearance which becomes an anti-pad is provided in an area between the through-hole and the power supply/ground layer 11. The signal line is extended from the through-hole through the clearance to an area above or below the power supply/ground layer. The portion of the signal line arranged in the vicinity of the power supply/ground layer in the clearance has an area of impedance gradient whose characteristic impedance is progressively lowered in a direction away from the through-hole.

In the printed circuit board according to the present invention, it is preferred that the power supply/ground layer has a void window in an area of the clearance and the through-hole. The window has a recess extending in a direction of extension of the signal line. The recess is narrowingly tapered as the recess progressively goes away from the through-hole. An area of the recess represents the area of the impedance gradient.

In the printed circuit board according to the present invention, it is preferred that the power supply/ground layer has a void window in an area of the clearance and the through-hole. The window has a protuberance narrowingly tapering as the recess progressively approaches the through-hole. An area of the protuberance represents the area of the impedance gradient.

If, in the printed circuit board according to the present invention, there is one through-hole in the clearance, the clearance is of the shape of a concentric circle having its center at a center axis of the through-hole.

In the printed circuit board according to the present invention, it is preferred that, if there are a plurality of through-holes in the clearance, the clearance is of the square shape.

In the printed circuit board according to the present invention, it is preferred that the surface of the power supply/ground layer in the area of impedance gradient, overlapping with the signal line, is increased in a direction away from the through-hole.

In the printed circuit board according to the present invention, it is preferred that a dielectric layer is formed in an area of the clearance except an area of said signal line.

The meritorious effects of the present invention are summarized as follows.

According to the present invention, the area of the gradient of characteristic impedance, in which the characteristic impedance is gradually changed from a high characteristic impedance toward the characteristic impedance of the signal line, is provided between the through-hole and the signal line, thereby improving transmission characteristics. Moreover, deterioration of transmission characteristics, otherwise generated due to branches (stubs) parasitically generated in the through-hole in the printed circuit board, may be suppressed, thereby accomplishing optimum transmission characteristics. In addition, the higher the impedance of the clearance, the better become the characteristics demonstrated. Further, the optimum transmission characteristics may be accomplished without dependency on the design/manufacture rule.

BRIEF DESCRIPTION OF THE DRAWINGS

FIG. 1A is a schematic plan view of a printed circuit board according to a first example of the present invention, FIG. 1B is a schematic cross-sectional view, taken along line X-X' of FIG. 1A, and FIG. 1C is a schematic cross-sectional view, taken along line Y-Y' of FIG. 1A.

FIG. 5A is a perspective view schematically showing the constitution of a backplane system in a conventional communication apparatus, FIG. 5B is a partial cross-sectional view taken along line X-X' of FIG. 5A, and FIG. 5C is an enlarged view of a portion encircled by a dotted line Y in FIG. 5B.

FIG. 6A is a partial plan view schematically showing the constitution of a printed circuit board of related art (comparative) example 1, FIG. 6B is a cross-sectional view taken along line X-X' of FIG. 6A, and FIG. 6C is a cross-sectional view taken along line Y-Y' of FIG. 6A.

PREFERRED MODES OF THE INVENTION

First Example

Figure 2:
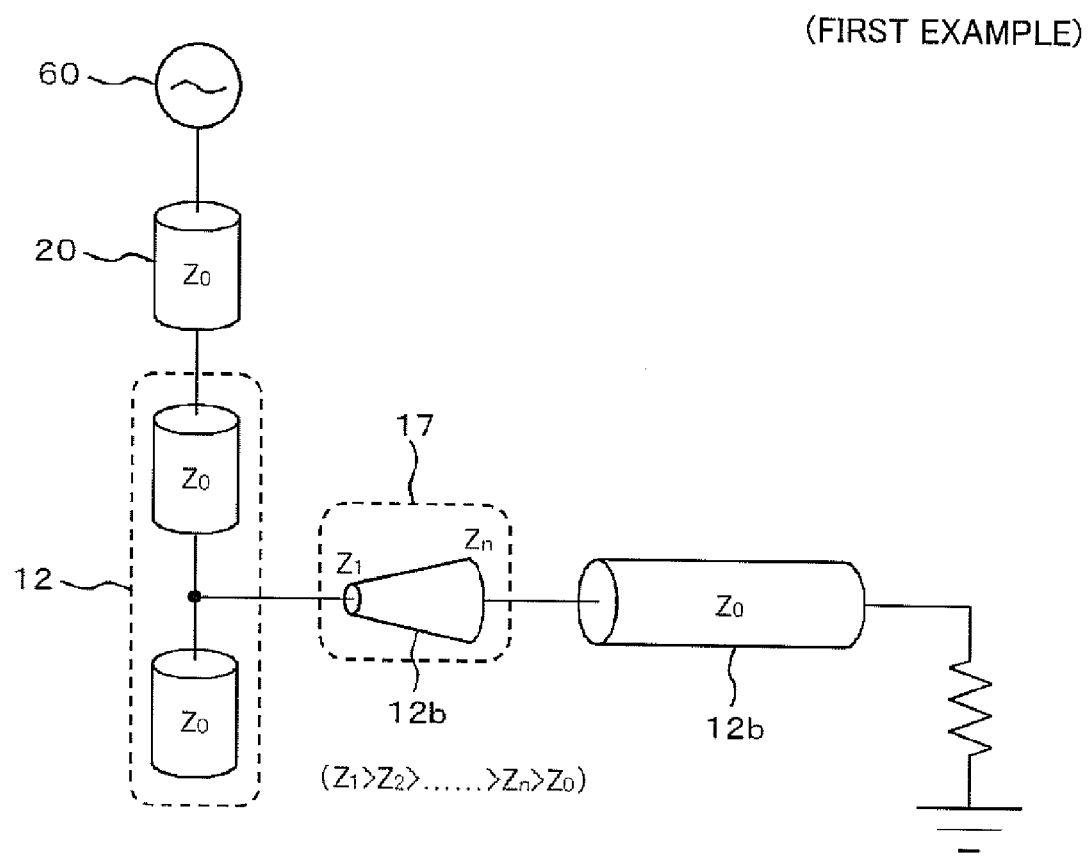
FIG. 2 is a schematic view for illustrating the gradient of the characteristic impedance of a printed circuit board according to the first example of the present invention.

A printed circuit board according to a first example of the present invention will now be described with reference to the drawings. FIGS. 1A to 1C schematically show the constitution of a printed circuit board according to the first example of the present invention. FIGS. 1A, 1B and 1C are a partial plan view, a cross-sectional view, taken along line X-X' of FIG. 1A, and a cross-sectional view, taken along line Y-Y' of FIG. 1A, respectively, and schematically show the constitution of a printed circuit board according to the first example of the present invention, respectively.

A printed circuit board 10 includes a plural number of power supply/ground layers 11 and a signal line 12b, both embedded in a dielectric layer 13, and a through-hole 12, directly connected to the signal line 12b.

The through-hole 12 is formed by drilling through the dielectric layer 13, having the layered structure, to form a drilled hole 15, and by forming a plating layer on a rim and the surface of the drilled hole 15. The hole portion per se of the through-hole 12 is defined by a finished hole 16 which is completed on finishing the plating-through operation. Lands 12a are formed on the rims on both ends of the finished hole 16. The through-hole 12 is directly connected to the signal line 12b. In an area between the through-hole 12 and the power supply/ground layers 11 (an all-over pattern and a pad), there is formed a clearance 14 that becomes an anti-pad of a size dependent on the manufacture tolerance. Like a clearance 114 of FIG. 6A, the clearance 14 generally describes a concentric circle, having the center of the through-hole 12 as axis, without regard to presence/non-presence of the signal line 12b. Meanwhile, in a configuration that deals with a differential signal, a square-shaped clearance 114, shown in FIG. 8, may sometimes be used in place of the clearance of a concentric circle. The dielectric layer 13 is provided in the clearance 14 (to fill the clearance 14).

The signal line 12b is connected at the site of the drilled hole 15 to the through-hole 12. The signal line 12b is extended across the clearance 14 to a space positioned between the neighboring power supply/ground layers 11, more specifically, to a space above or below a given one of the power supply/ground layers 11. The signal line 12b is not directly connected to the power supply/ground layers 11, viz., the dielectric layer 13 is provided between the signal line 12b and the associated power supply/ground layers 11 (to fill the space).

A plurality of the power supply/ground layers 11 are provided in the dielectric layer 13. Only one power supply/ground layer 11 may also be used, if so desired. The power supply/ground layer 11 has a window 11a delimiting a void space in an area of the through-hole 12 and the clearance 14. The window 11a presents a recess 11b narrowingly tapered as the window is progressively spaced apart from the through-hole 12 along the direction of extension of the signal line 12b. The recess 11b is formed so that the characteristic impedance of the signal line 12b is gradually chanced from a high characteristic impedance of the signal line portion in the vicinity of the power supply/ground layer 11 in the clearance 14 to a characteristic impedance intrinsic to the power supply/ ground layer 11, that is, so that the characteristic impedance of the signal line 12b is gradually lowered in a direction away from the through-hole 12. That is, an impedance gradient area 17 of the signal line 12b is formed. In general, the characteristic impedance of the signal line 12b is determined by its electromagnetic coupling with the power supply/ground layer 11, and the physical distance is taking part in determining the characteristic impedance. The gradient of the characteristic impedance may be achieved by gradually changing the manner of superposition of the signal line 12b with the power supply/ground layer 11, that is, by gradually increasing the area of superimposition between the signal line 12b and the power supply/ground layer 11, in a direction away from the through-hole 12. The dielectric layer 13 is arranged in an area of the clearance 14 in the window 11a and the recess 11b, except an area of the signal line 12b.

Figure 3:
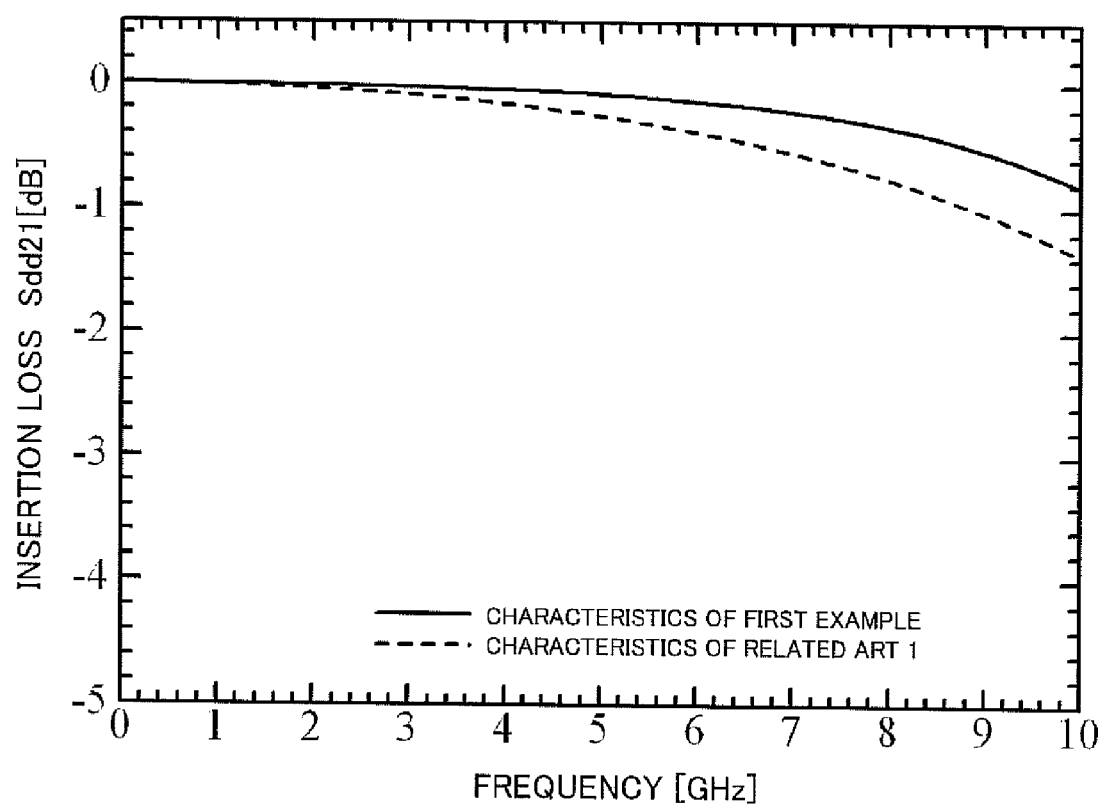
FIG. 3 is a graph schematically showing the results of simulation of the insertion loss in the differential transmission in the printed circuit board according to the first example of the present invention.
Figure 7:
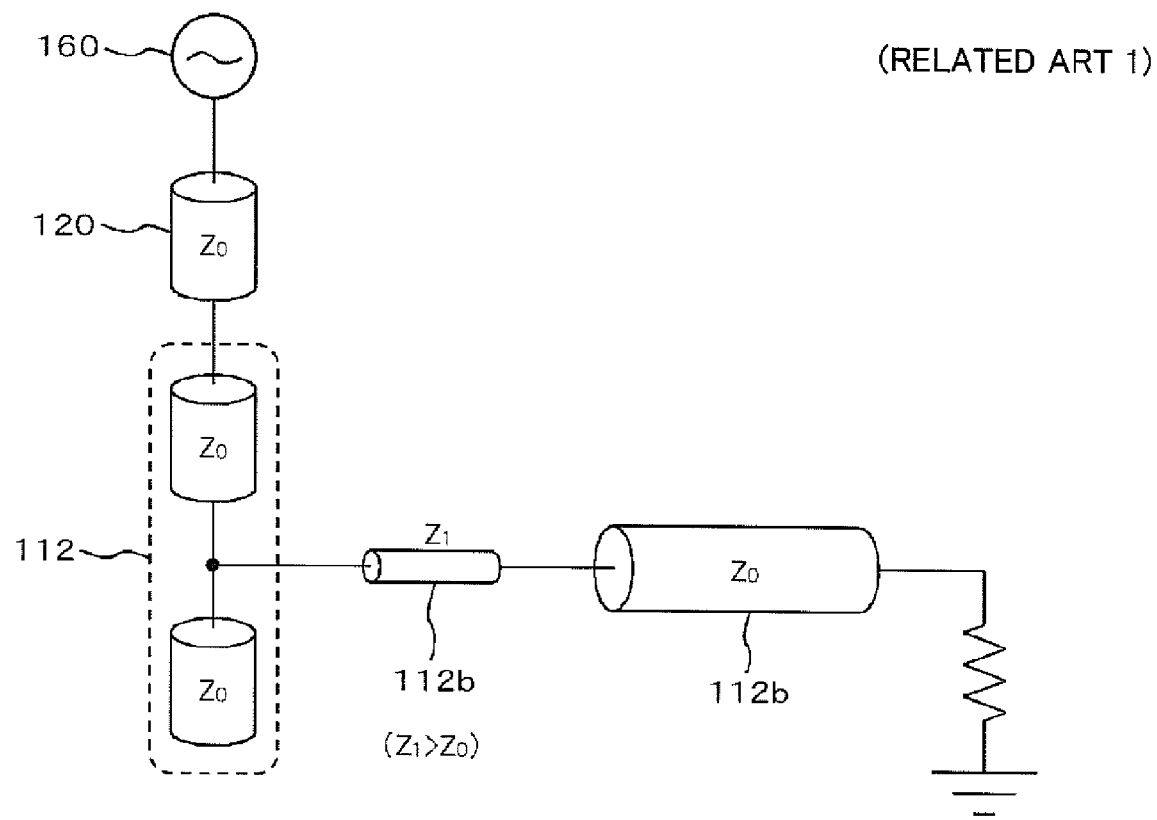
FIG. 7 is a schematic view for illustrating the gradient of the characteristic impedance of the printed circuit board according to related art (comparative) example 2.

The effectiveness of the gradient of the characteristic impedance in the printed circuit board of the first example of the present invention will now be described with reference to the drawings. FIG. 2 is a schematic view (analogous circuit) for illustration of the gradient of the characteristic impedance in the printed circuit board of the first example of the present invention. FIG. 7 is a schematic view (analogous circuit) for illustration of the gradient of the characteristic impedance in the printed circuit board of the related-art example 1. FIG. 3 is a graph schematically showing the results of simulation of insertion loss (Sdd21) in differential transmission in the printed circuit boards of the present example and the related art example 1.

In the schematic views of FIGS. 2 and 7, the signal transmitted from a signal source (60 or 160) is coupled via ideal connector (20 or 120) to a through-hole (12 or 112). Since the signal lines (12b, 112b) are led out at a half-way point of the through-hole (12, 112), the portions of the through-holes lying below the signal lines (12b, 112b) in FIGS. 1B and 6B become stubs (18, 118) to deteriorate the signal propagation characteristics. In the constitution of FIGS. 6A to 6C, correlated with FIG. 7, the electro-magnetic coupling with the power supply/ground layers 111 of the portion of the pattern of the signal line 112b in register with the clearance 114 becomes weak, with the result that the characteristic impedance of this portion of the signal line 112b becomes higher. This very portion of the signal line 112b, lying in register with the clearance, connects to the pattern of the signal line 112b lying in register with the power supply/ground layers. Conversely, with the constitution of FIGS. 1A to 1C, correlated with FIG. 2, the portion (boundary area) of the signal line 12b that comes into register with the clearance 14 constitutes the gradient of the characteristic impedance. That is, the high characteristic impedance of the portion of the signal line 12b in the vicinity of the power supply/ground layer 11 in the clearance 14 gradually approaches to the characteristic impedance of the pattern of the signal line 12b lying in register with the power supply/ground layers.

FIG. 3 shows the result of the simulation of the insertion loss (Sdd21) in the differential transmission. In the first example, shown in FIG. 2, the characteristics is improved by approximately 0.5 dB over the related art (comparative) example 1 of FIG. 7 for 10 GHz which is 20 Gbps in terms of the transmission rate. For example, in a backplane system of a communication apparatus (see FIGS. 5A to 5C), there are at least four through-holes 112 (one in a network card 130, two in a printed circuit board 110 and one in a switch card 140), so that improvement by approximately 2 dB may be achieved in sum as a transmission system. It is noted that the simulation example shown in FIG. 3 is an example of a certain model and further meritorious effects may be expected to be achieved under different conditions.

The transmission coefficient in a plurality of transmission channels of different characteristic impedances is expressed by the following equation 1:

$$\text{transmission coefficient} = 2 \times Z2 \div (Z2 + Z1) \tag{1}$$

where Z1, Z2 denote respective characteristic impedances and where it is assumed that propagation is from Z1 to Z2. If Z1=Z2, the transmission coefficient is equal to unity so that all signals are transmitted.

Further, if propagation is from characteristic impedance Z1 to a branch of characteristic impedances Z3 and Z4, these characteristic impedances Z3 and Z4 may be expressed as parallel impedances and, by putting the impedances as in the equation (2):

$$Z2 = Z3 \times Z4 \div (Z3 + Z4) \tag{2}$$

the relationship involving the transmission coefficient may be expressed by the equation which is the same as the equation (2). For example, if Z3=Z4, Z2=Z3÷2.

It is now supposed that the propagation is from a transmission path of the characteristic impedance Z1 to the characteristic impedances Z1, Z3. It will be appreciated that if, in this case, a synthesized (combined) impedances of Z1, Z3 is close to Z1, the transmission coefficient approaches to unity, which is favorable for transmission. In the related art example 1 (see FIGS. 6A to 6C), the characteristic impedance of the signal line portion in register with the clearance 114 is high, thus satisfying the condition. However, at an area of transition from the signal line portion lying in register with the clearance 114 to the signal line portion overlapping with the power supply line/ground layers, the signal actually transmitted to the pattern of the signal line 112b decreases in accordance with the equation (1).

In the present example, the gradient of the characteristic impedance is afforded to the signal line portion in register with the clearance 14 in the vicinity (boundary area) of the power supply/ground layers, thereby improving signal transmission characteristics.

With the first example, the adverse effect of the parasitic stub in the through-hole, which hitherto accounted for deterioration of characteristics in high-speed transmission, may be suppressed by a simple signal line pattern constitution. That is, the BGA (Ball Grid Array) connector, free of stubs, and the inner-layer via-hole, so far considered to be necessary for transmission at a transmission rate of 10 Gbps or higher, may be replaced by a press-fit connector and a through-hole. Since the press-fit connector may be used, high operational reliability in card insertion/removal may be maintained to reduce the cost.

Second Example

Figure 4:
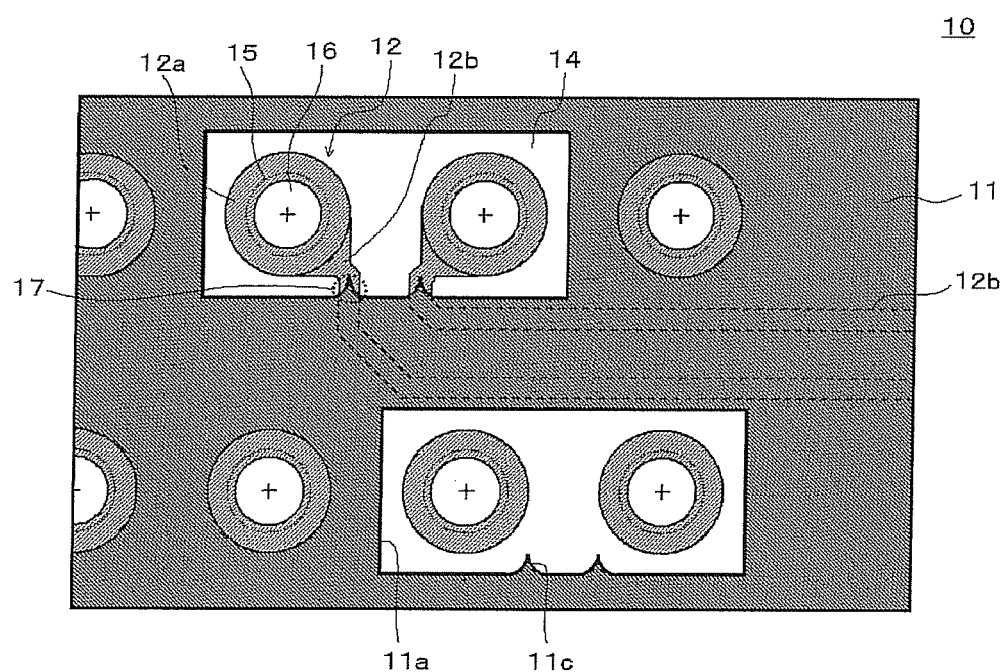
FIG. 4 is a partial plan view schematically showing the constitution of a printed circuit board according to a second example of the present invention.

A printed circuit board according to a second example of the present invention will now be described with reference to the drawings. FIG. 4 is a partial plan view showing the constitution of a printed circuit substrate according to the second example of the present invention.

Figure 8:
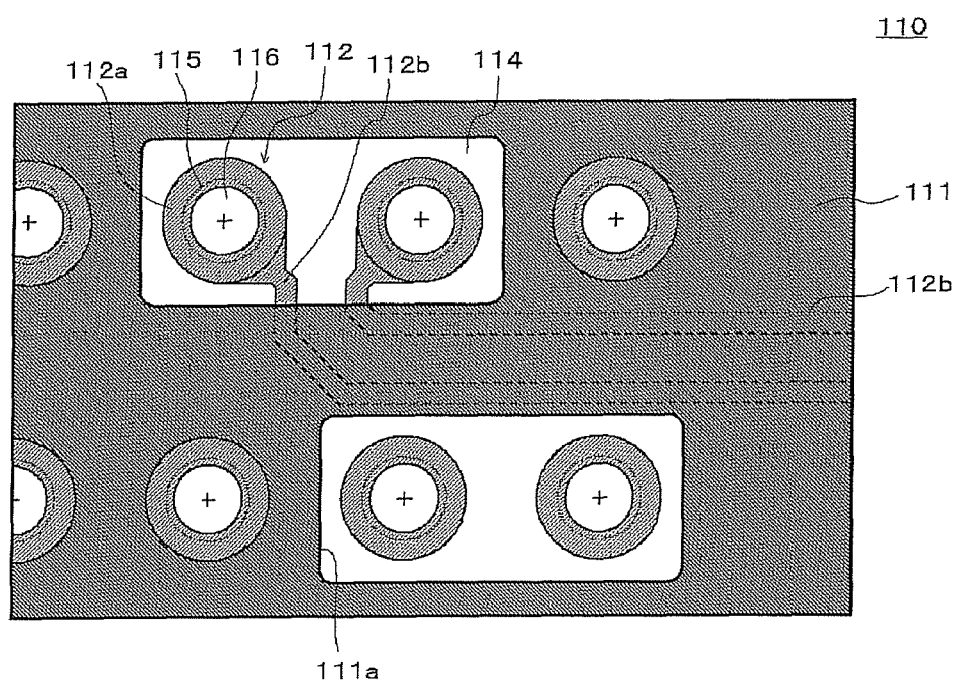
FIG. 8 is a partial plan view schematically showing the constitution of the printed circuit board according to the related art example 2.

The printed circuit substrate of the second example has a through-hole for a backplane connector for differential transmission. A related art technique (comparative example) correlated with the printed circuit substrate of the second example of FIG. 4 is shown in FIG. 8. A clearance 14 of FIG. 4 with a sole square shape is used to constitute a differential pair. The gradient of the characteristic impedance of the connection from the portion of the signal line 12*b* within the clearance 14 to the signal line 12*b* overlapped with the power supply layer/ground layer is formed not by a recess (11*b* of FIG. 1A) provided in the power supply/ground layer 11, but by a protuberance 11*c*. This results because the connector part is overcrowded with signals and hence a recess, if formed, may interfere with control of the characteristic impedance of the other signal lines 12*b*. The power supply/ground layer 11 has a window 11*a*, delimiting a void space, in the area provided with the through-hole 12 and with the clearance 14. The window 11*a* includes protuberances 11*c* each tapering towards each of the through-holes 12 in a direction of extension of each of the signal lines 12*b*. The area of the window including the protuberance 11*c* becomes an impedance gradient area.

The present second example gives a meritorious effect similar to that of the first example described above.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A printed circuit board comprising:
   a power supply/ground layer and a signal line disposed in a dielectric layer;
   and a through-hole connected to said signal line; wherein
   a clearance which becomes an anti-pad is provided in an area between said through-hole and said power supply/ground layer;
   said signal line is extended from said through-hole through said clearance to an area above or below said power supply/ground layer; and
   a portion of the signal line arranged in the vicinity of the power supply/ground layer in the clearance has an area of impedance gradient whose characteristic impedance is progressively lowered in a direction away from said through-hole.

2. The printed circuit board according to claim 1, wherein said power supply/ground layer has a void window in an area of said clearance and said through-hole; and wherein
   said window has a recess extending in a direction of extension of said signal line; said recess narrowingly tapering as the recess progressively goes away from said through-hole;
   an area of said recess representing said area of the impedance gradient.

3. The printed circuit board according to claim 1, wherein said power supply/ground layer has a void window in an area of said clearance and said through-hole; and
   said window has a protuberance narrowingly tapering as the recess progressively approaches said through-hole;
   an area of said protuberance representing said area of the impedance gradient.

4. The printed circuit board according to claim 1, wherein if there is one said through-hole in said clearance, said clearance is of a concentric circle shape having its center at a center of said through-hole.

5. The printed circuit board according to claim 1, wherein if there are a plurality of said through-holes in said clearance, said clearance is of a square shape.

6. The printed circuit board according to claim 1, wherein an area of said power supply/ground layer in said area of impedance gradient, overlapping with said signal line, is increased in a direction away from said through-hole.

7. The printed circuit board according to claim 1, wherein a dielectric layer is formed in an area of said clearance except in an area of said signal line.

* * * * *